United States Patent
Johnson et al.

(10) Patent No.: US 11,142,843 B2
(45) Date of Patent: Oct. 12, 2021

(54) POLYCRYSTALLINE TEXTURED MATERIALS EXHIBITING HETEROGENEOUS TEMPLATED GRAIN GROWTH, METHODS OF FORMING THE SAME, AND RELATED SYSTEMS

(71) Applicant: BRIGHAM YOUNG UNIVERSITY, Provo, UT (US)

(72) Inventors: Oliver Kent Johnson, Provo, UT (US); Dallin James Frandsen, Provo, UT (US)

(73) Assignee: BRIGHAM YOUNG UNIVERSITY, Provo, UT (US)

( * ) Notice: Subject to any disclaimer, the term of this patent is extended or adjusted under 35 U.S.C. 154(b) by 0 days.

(21) Appl. No.: 15/765,964

(22) PCT Filed: Sep. 8, 2017

(86) PCT No.: PCT/US2017/050643
§ 371 (c)(1),
(2) Date: Apr. 4, 2018

(87) PCT Pub. No.: WO2018/049134
PCT Pub. Date: Mar. 15, 2018

(65) Prior Publication Data
US 2018/0282901 A1 Oct. 4, 2018

Related U.S. Application Data

(60) Provisional application No. 62/385,418, filed on Sep. 9, 2016.

(51) Int. Cl.
*C30B 28/02* (2006.01)
*C04B 35/64* (2006.01)
(Continued)

(52) U.S. Cl.
CPC ............ *C30B 28/02* (2013.01); *C04B 35/622* (2013.01); *C04B 35/626* (2013.01);
(Continued)

(58) Field of Classification Search
CPC ........ C30B 28/02; C04B 35/64; C04B 35/626
See application file for complete search history.

(56) References Cited

U.S. PATENT DOCUMENTS

2002/0153809 A1* 10/2002 Chen ...................... H01L 41/18
310/360
2003/0035253 A1* 2/2003 Lin ........................ B82Y 10/00
360/324

(Continued)

FOREIGN PATENT DOCUMENTS

CN 1669985 9/2005

OTHER PUBLICATIONS

International Search Report and Written Opinion for International Application PCT/US2017/050643 dated Nov. 8, 2017.
(Continued)

*Primary Examiner* — Robert M Kunemund
(74) *Attorney, Agent, or Firm* — Dorsey & Whitney LLP

(57) ABSTRACT

Embodiments disclosed herein are related to polycrystalline textured materials exhibiting heterogeneous templated grain growth, methods of forming such materials, and related systems. An example of a method of forming a polycrystalline textured material exhibiting heterogeneous templated grain growth includes providing a plurality of seeds. The method also includes aligning at least some of the plurality of seeds (e.g., single-crystal seeds) so that a selected crystallographic orientation of at least some of the plurality of seeds are substantially aligned with each other. Additionally, the method includes positioning the plurality of seeds in a powder matrix. The method then includes pressing the
(Continued)

plurality of seeds and the powdered matrix to form a green body. Further, the method includes sintering the green body at a temperature that is sufficient to grow a plurality of grains from corresponding ones of the plurality of seeds to form the polycrystalline textured material.

41 Claims, 7 Drawing Sheets

(51) Int. Cl.
*C04B 35/626* (2006.01)
*C04B 35/622* (2006.01)
*C04B 35/63* (2006.01)

(52) U.S. Cl.
CPC .......... *C04B 35/6303* (2013.01); *C04B 35/64* (2013.01); *C04B 2235/5292* (2013.01); *C04B 2235/5296* (2013.01); *C04B 2235/5436* (2013.01); *C04B 2235/5445* (2013.01); *C04B 2235/5454* (2013.01); *C04B 2235/602* (2013.01); *C04B 2235/604* (2013.01); *C04B 2235/6567* (2013.01); *C04B 2235/6581* (2013.01); *C04B 2235/77* (2013.01); *C04B 2235/78* (2013.01); *C04B 2235/781* (2013.01); *C04B 2235/783* (2013.01); *C04B 2235/785* (2013.01); *C04B 2235/786* (2013.01); *C04B 2235/787* (2013.01)

(56) References Cited

U.S. PATENT DOCUMENTS

2006/0006360 A1 1/2006 Takao et al.
2014/0295138 A1 10/2014 Yan et al.

OTHER PUBLICATIONS

U.S. Appl. No. 62/385,418, filed Sep. 9, 2016.
Messing, et al., "Templated Grain Growth of Textured Piezoelectric Ceramics", Critical Reviews in Solid State and Materials Sciences, vol. 29, Apr. 1, 2004, 45-89.
Liu, "Progress on the fabrication of lead-free textured piezoelectric ceramics: perspectives over 25 years", J Mater Sci: Mater Electron, Mar. 11, 2015, 13 pages.
Sabolsky, et al., "Kinetics of Templated Grain Growth of 0.65Pb(Mg1/3Nb2/3)O3● 0.35PbTiO3", Journal of the American Ceramic Society, Nov. 2001, pp. 2507-2513.

* cited by examiner

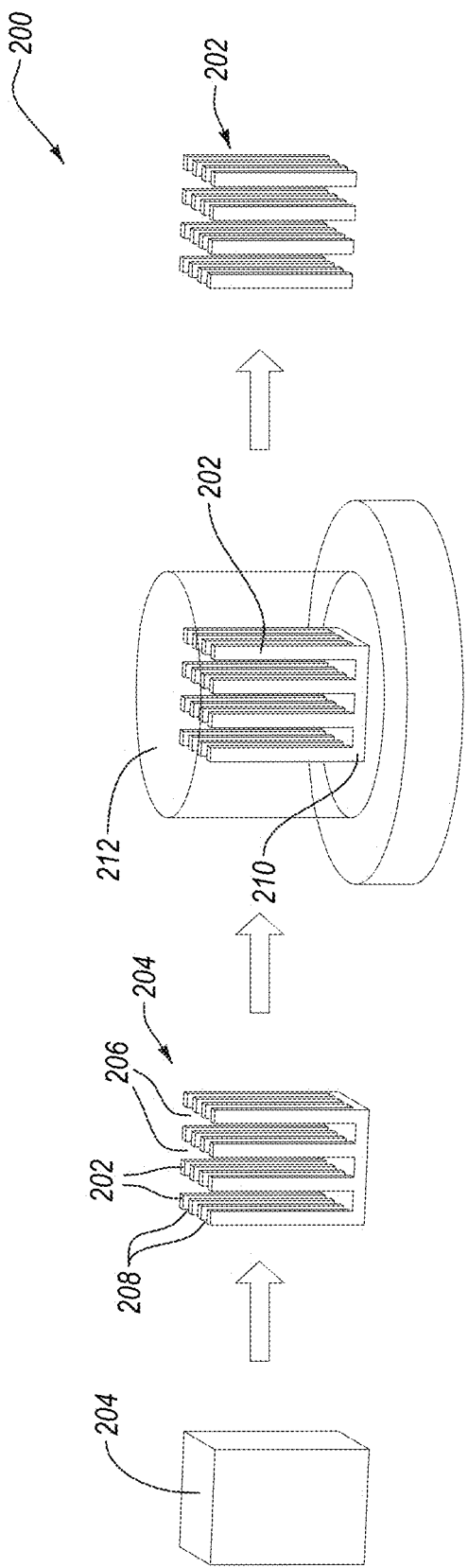
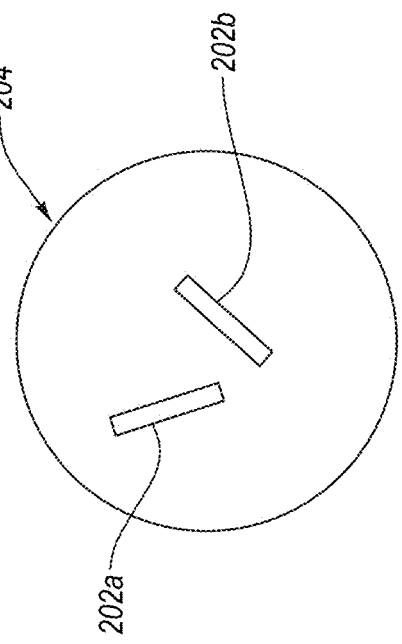
FIG. 2A
FIG. 2B

POLYCRYSTALLINE TEXTURED MATERIALS EXHIBITING HETEROGENEOUS TEMPLATED GRAIN GROWTH, METHODS OF FORMING THE SAME, AND RELATED SYSTEMS

CROSS-REFERENCE TO RELATED APPLICATIONS

This application is a U.S. Nationalization of PCT/US2017/050643 filed on 8 Sep. 2017, which claims priority to U.S. Provisional Application No. 62/385,418 filed on 9 Sep. 2016, the disclosure of each of which is incorporated herein, in its entirety, by this reference.

BACKGROUND

Single-crystal materials can exhibit properties that are different than compositionally similar polycrystalline materials. For example, single-crystal materials lack grain boundaries which cause the single-crystal material to exhibit properties (e.g., diffusion, creep resistance, etc.) that are different than compositionally similar polycrystalline materials. However, single-crystal materials can be significantly more difficult and time consuming to manufacture than compositionally similar polycrystalline materials which can adversely affect the cost and availability of single-crystal materials.

Polycrystalline materials can exhibit crystalline texture ("polycrystalline textured materials"). Polycrystalline textured materials have non-uniform distribution of crystallographic orientations wherein at least one of the crystallographic orientations are more prevalent (e.g., preferred) than other crystallographic orientations. Polycrystalline textured materials can exhibit properties that range from close to those of a compositionally similar single-crystal material to those of compositionally similar polycrystalline materials that do not have crystalline texture ("polycrystalline untextured materials"). In many cases, the properties of polycrystalline textured materials can exceed (i.e. be better than) the properties of both compositionally similar single crystalline materials and polycrystalline untextured materials. Additionally, polycrystalline textured materials can be manufactured more easily and faster than compositionally similar single-crystal materials.

As such, manufacturers and users of single-crystal materials and polycrystalline textured material continue to seek improved methods of forming polycrystalline textured materials.

SUMMARY

Embodiments disclosed herein are related to polycrystalline textured materials exhibiting heterogeneous templated grain growth, methods of forming such materials, and related systems. In an embodiment, a method to form a polycrystalline textured material exhibiting heterogeneous templated grain growth is disclosed. The method includes providing a plurality of seeds. The method also includes aligning at least some of the plurality of seeds so that a crystallographic orientations of the at least some of the plurality of seeds are substantially aligned with each other. Additionally, the method includes, after the aligning at least some of the plurality of seeds, positioning the at least some of the plurality of seeds in a powder matrix. The method further includes pressing the plurality of seeds and the powder matrix to form a green body. The method also includes sintering the green body at a temperature that is sufficient to grow a plurality of grains from corresponding ones of the plurality of seeds to form the polycrystalline textured material.

In an embodiment, a method to form a polycrystalline textured material exhibiting heterogeneous template grain growth is disclosed. The method includes providing a plurality of seeds that each exhibits an elongated shape. The elongated shape exhibits a long axis, a medium axis, and a short axis. The method also includes aligning at least some of the plurality of seeds so that: the long axes of the at least some of the plurality of seeds are substantially aligned with each other; the medium axes of the at least some of the plurality of seeds are substantially aligned with each other; and the short axes of the at least some of the plurality of seeds are substantially aligned with each other. The method further includes positioning the at least some of the plurality of seeds in a powder matrix. Additionally, the method includes pressing the at least some of the plurality of seeds and the powder matrix to form a green body. Also, the method includes sintering the green body at a temperature that is sufficient to grow a plurality of grains from corresponding ones of the at least some of the plurality of seeds to form the polycrystalline textured material In an embodiment, a machine to form a polycrystalline textured material exhibiting heterogeneous templated grain growth is disclosed. The system includes at least one aligner comprising a loading portion that is configured to hold a plurality of seeds and an aligning portion extending from the loading portion to an outlet thereof. The aligning portion includes a plurality of channels that are separated by walls. The plurality of channels exhibits a spacing selected to align a longitudinal direction of each of the plurality of seeds in substantially similar directions. The system also includes a platform positioned to receive the plurality of seeds that are dispensed from the outlet of the at least one aligner.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the present disclosure, wherein identical reference numerals refer to identical or similar elements or features in different views or embodiments shown in the drawings.

FIG. 2A is a schematic illustration of a method to form a plurality of seeds that facilitate alignment thereof, according to an embodiment.

FIG. 2B is a top plan view of a single-crystal block, according to an embodiment.

DETAILED DESCRIPTION

Figure 1:
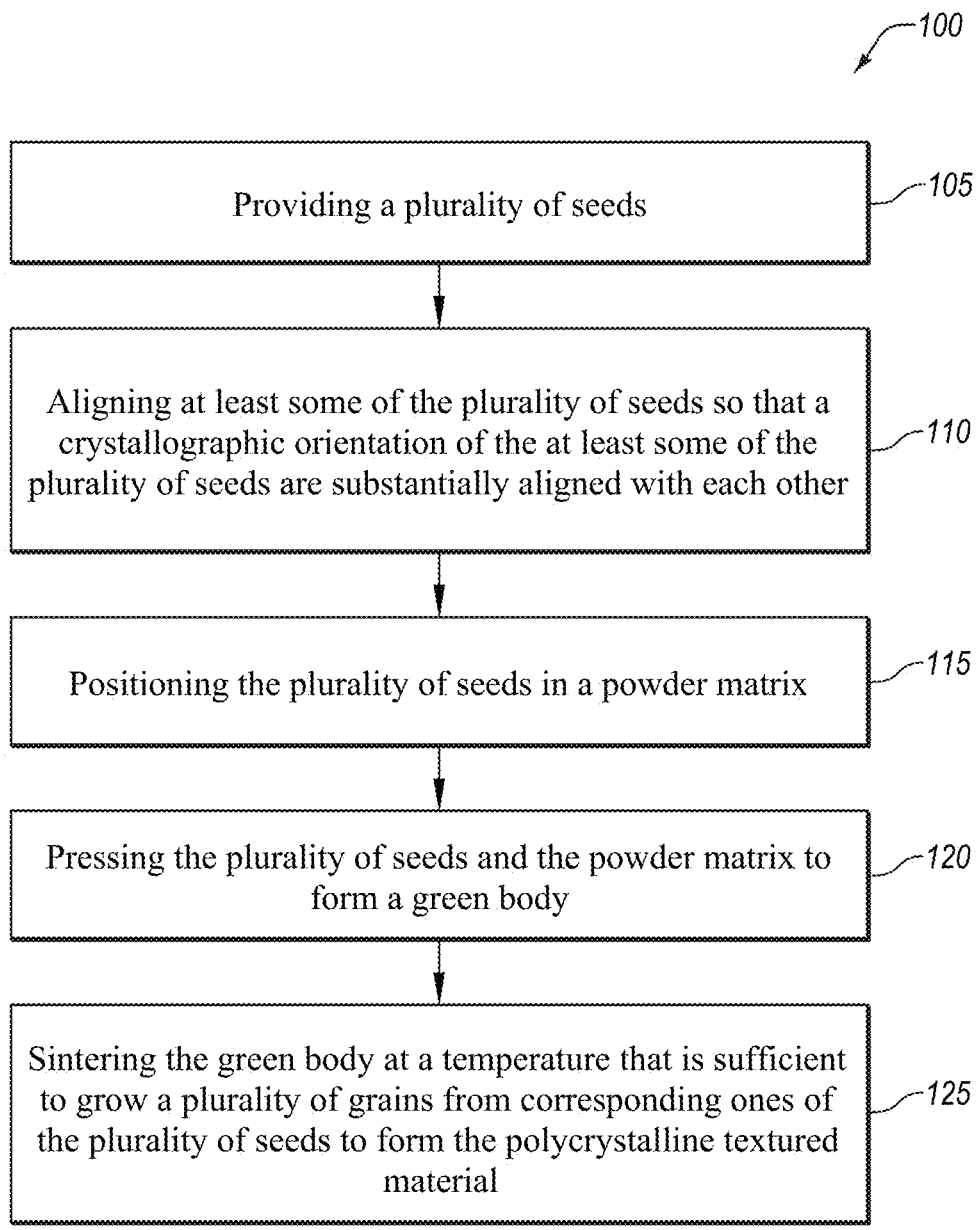
FIG. 1 is a flow chart of a method to form a polycrystalline textured material exhibiting heterogeneous templated grain growth, according to an embodiment.

Embodiments disclosed herein are related to polycrystalline textured materials exhibiting heterogeneous templated grain growth, methods of forming such materials, and related systems. An example of a method of forming a polycrystalline textured material exhibiting heterogeneous templated grain growth includes providing a plurality of seeds. The method also includes aligning at least some of the plurality of seeds (e.g., single-crystal seeds) so to that a selected crystallographic orientation of at least some of the plurality of seeds are substantially aligned with each other. Additionally, the method includes positioning the at least some plurality of seeds so aligned in a powder matrix. The method also includes pressing the plurality of seeds and the powdered matrix to form a green body. Further, the method includes sintering the green body at a temperature that is sufficient to grow a plurality of grains from corresponding ones of the plurality of seeds to form the polycrystalline textured material.

In a particular embodiment, the method of forming a polycrystalline textured material exhibiting heterogeneous templated grain growth includes providing a plurality of first seeds that each exhibits a first crystallographic orientation. Aligning at least some of the plurality of first seeds can include aligning the first seeds such that a coordinate system of unit cells of one of the first seeds is substantially aligned (e.g., substantially coincidence) with a coordinate system attached to unit cells of another one of the first seeds. As such, aligning the seeds includes aligning at least some of the plurality of seeds macroscopically so that the microscopic distribution a crystallographic orientations of the at least some of the plurality of seeds match those of a desired target distribution. Aligning the seeds such that the crystallographic orientations of the seeds are substantially aligned provides better control over the grain boundaries of the polycrystalline texture material than aligning the seeds such that the crystallographic directions or planes of the seeds are substantially aligned (e.g., parallel) since aligning the crystallographic directions or planes of the seeds still allows at least one degree of freedom.

In an example, the method can include providing a plurality of second seeds that each exhibits a second crystallographic orientation that is different than the first crystallographic orientation. The method can also include aligning at least some of the second seeds such that a coordinate system of unit cells of one of the second seeds is substantially aligned with a coordinate system of unit cells of another one of the second seeds. In an example, the method can also include providing a plurality of additional seeds, such as a plurality of third seeds, a plurality of fourth seeds, a plurality of tenth seeds, a plurality of hundredth seeds, etc. that each exhibit different crystallographic orientations. The distribution of each type of the seeds (e.g., the first seeds, the second seeds, etc.) can be controlled based on the amount of each type of seed that is used to form the polycrystalline textured material. The distribution of each type of the seeds allows precise control over the grain boundaries of the polycrystalline textured material.

FIG. 1 is a flow chart of a method 100 to form a polycrystalline textured material exhibiting heterogeneous templated grain growth, according to an embodiment. Unless specified, the acts of the method 100 can be performed in any order. In some embodiments, at least one of the acts can be supplemented, split into a plurality of acts, combined with another act, and/or omitted. Also, it is understood that additional acts can be added to the method 100. For example, the additional acts can include machining the polycrystalline textured material or the green body. In another example, the additional acts can include characterizing the polycrystalline textured material to quantify the crystallographic orientation(s) thereof.

The example method 100 may begin with act 105, which recites "providing a plurality of seeds." Act 105 can be followed by act 110, which recites "aligning at least some of the plurality of seeds so that a selected crystallographic orientation of the at least some of the plurality of seeds are substantially aligned with each other." Act 110 can be followed by act 115, which recites "after aligning the at least some of the plurality of seeds, positioning the at least some of the plurality of seeds in a powder matrix." Act 115 can be followed by act 120, which recites "pressing the plurality of seeds and the powder matrix to form a green body." Act 120 can be followed by act 125, which recites "sintering the green body at a temperature that is sufficient to grow a plurality of grains from corresponding ones of the plurality of seeds to form the polycrystalline textured material."

The method 100 includes act 105, which recites "providing a plurality of seeds." For example, act 105 can include providing a plurality of seeds that are single-crystal. In another example, act 105 can include providing a plurality of seeds that are polycrystalline, such as seeds exhibiting oriented grain growth or crystalline texture. The seeds, in aggregate, exhibit a distribution of crystallographic orientation(s) that are desirable to form a selected polycrystalline textured material (e.g., a polycrystalline textured material exhibiting selected grain boundaries). It is noted that seeds that are single-crystal provide better control over the grain boundaries of the polycrystalline textured material exhibiting heterogeneous textured grain growth than seeds that are polycrystalline.

The plurality of seeds can be formed from any suitable material. For example, the plurality of seeds can be formed from a metal, such as copper, iron, aluminum, gold, silver, platinum, titanium, vanadium chromium, manganese, cobalt, nickel, zinc, tin, zirconium, niobium, molybdenum, palladium, cadmium, tantalum, tungsten, rhenium, platinum, lead, another suitable metal, a superalloy, steels, combinations thereof, or alloys thereof. In another example, the plurality of seeds can be formed from a ceramic, such a silicon, zinc oxide, another semi-conductor, alumina, silicon carbide, silicon nitride, boron nitride, boron oxide, titanium carbide, barium titanate, bismuth strontium calcium copper oxide, magnesium diboride, yttrium barium copper oxide, ferrite, zirconium dioxide, lead zirconate titanate, or another suitable ceramic. In another example, the seeds can be formed from a polymer, such as a semi-crystalline polymer or a crystalline polymer.

Act 105 can include providing seeds that have a selected crystallographic orientation(s) that is configured to at least partially control the grain boundaries. For example, each of the seeds is configured to grow into a larger grain exhibiting approximately the same crystallographic orientation as the seed. The grain boundary energy depends, at least partially, on the crystallographic orientations of the grains that form the grain boundary.

In an embodiment, act 105 includes providing seeds that all exhibit the same crystallographic orientation. In such an embodiment, the seeds grow into larger grains that all exhibit substantially the same crystallographic orientation. As such, all of the grain boundaries exhibit substantially the same grain boundary energy because all of the grains have substantially the same crystallographic orientation. In another embodiment, act 105 includes providing different types of seeds and each of the different types of seeds exhibit different crystallographic orientations. The amount of each type of seeds provided affects the distribution of the different crystallographic orientations in the resulting polycrystalline textured material. For example, act 105 can include providing at least one (e.g., a plurality of) first seed exhibiting a first crystallographic orientation and at least one (e.g., a plurality of) second seed having a second crystallographic orientation that is different than the first crystallographic orientation. In such an example, the first and second seeds nucleate grains that exhibit different crystallographic orientations (e.g., the first and second crystallographic orientations). As such, the grains formed from seeds exhibiting a different crystallographic orientations exhibit grain boundary energies (e.g., average grain boundary energy) that is different than the grain boundary energies formed from grains exhibiting the same crystallographic orientation. Therefore, the grain boundary energies that are formed can be controlled depending on the crystallographic orientation(s) of the seeds that are provided in act 105.

The grain boundaries can be further controlled by controlling the amount of the different type of seed that is provided (e.g., the amount of the first seeds relative to the amount of the second seeds). Controlling the amount of the different types of seeds enables control of the distribution of the crystallographic orientations of grains grown from the different types of seeds which, in turn, allows for control of the grain boundaries. For example, providing more of the first seeds than the second seeds can cause the polycrystalline textured material to include more first grains that exhibit the first crystallographic orientation than second grains that exhibit the second crystallographic orientation. For instance, act 105 can include providing at least about 1 weight % more of the first seeds than the second seeds, such as at least about 10 weight % more, at least about 25 weight % more, at least about 50 weight % more, at least about 100 weight % more, at least about 200 weight % more, at least about 500 weight % more, at least about 1,000 weight % more, at least about 2,000 weight % more, at least about 5,000 weight % more, or at least about 10,000 weight % more of the first seeds than the second seeds. In such an example, the polycrystalline textured material is likely to have more grain boundaries formed between the first grains than grain boundaries formed between the first and second grains or formed between the second grains. In another example, providing equal amounts of the first and second seeds can cause the polycrystalline textured material to include relatively equal amounts of grain boundaries formed between the first grains, formed between the second grains, and formed between the first and second grains.

In an embodiment, the first and second seeds are formed from the same material. In another embodiment, the first and second seeds are formed from different materials. In such an embodiment, the first and second seeds should be formed from materials that exhibit a lattice mismatch that is less than 15% with a base material of the powder matrix, as will be discussed in more detail below.

It is noted that act 105 can include the at least one first seed, the at least one second seed, and at least one additional seed that exhibits a crystallographic orientation that is different than the first and second crystallographic orientations. For example, act 105 can include providing one or more of at least one (e.g., a plurality of) third seed exhibiting a third crystallographic orientation that is different than the first and second crystallographic orientations, at least one (e.g., a plurality of) fourth seed exhibiting a fourth crystallographic orientation that is different than the first, second, and third crystallographic orientations, etc. It is noted that act 105 can include providing any number of different types of seeds that each exhibits different crystallographic orientations. For instance, act 105 can include providing at least 3, at least 4, at least 5, at least 6, at least 7, at least 8, at least 9, at least 10, at least 15, at least 20, at least 25, at least 30, at least 40, at least 50, at least 75, at least 100, at least 200, at least 500, or at least 1,000 different types of seeds and each of the different types of seeds exhibits crystallographic orientations that are different from each other.

Act 105 can include providing a plurality of seeds exhibiting any suitable shape or size. For example, act 105 can include providing a plurality of seeds that exhibit a generally platelet- or disk-like shape. In another example, act 105 can include providing a plurality of whisker-like shapes exhibiting an average diameter than is less than 5 μm. In an example, act 105 can include providing seeds that exhibit an elongated shape (e.g., a generally right rectangular prism), such as an elongated shape having an anisometric geometry. The elongated shape can exhibit a long axis (e.g., a longitudinal axis), a medium axis, and a short axis. The elongated shape of the seeds can facilitate the alignment of the plurality of seeds such that seeds exhibiting the same crystallographic orientation are aligned (e.g., the coordinate system of unit cells of the seeds that exhibit the same crystallographic orientation are aligned). The elongated shape of the seeds can also facilitate the alignment of the plurality of seeds such that the long axes of the seeds are aligned, the medium axes of the seeds are aligned, and the short axes of the seeds are aligned, regardless of the crystallographic orientation of the seeds. In an example, act 105 can include providing seeds that all exhibit the same size and/or shape. In such an example, act 105 can include providing seeds that exhibit the same size and/or shape regardless of crystallographic orientation.

In an example, the elongated shape can also exhibit a single large flat surface or two generally opposing large flat surfaces. The large flat surface can be substantially parallel to the long and medium axes of the elongated shape. The large flat surface exhibits a surface area that is at least 1.25 times greater (e.g., at least 2 times greater, at least 5 times greater, at least 10 times greater, at least 25 times greater, or at least 100 times greater) than any other flat surface of the elongated shape (e.g., any surface of the elongated shape that is parallel to the short axes of the elongated shape). The large flat surface of the elongated shape biases the seed to lie on the large flat surface thereby causing the seeds to be rotated in the same direction. As such, the large flat surface of the elongated shape better ensures that the seeds are substantially aligned in a specific manner (e.g., the long, medium, and short axes of the seeds are substantially aligned; the crystallographic orientations of the same type of seeds are substantially aligned, etc.). I The seeds provided in act 105 can exhibit a minimum dimension (e.g., an average thickness). In an example, the minimum dimension of the seeds can be greater than 15 μm since this is the smallest average minimum dimension that can be formed using most wire electrical discharge machining ("EDM") devices. For instance, the seeds can exhibit a minimum dimension that is greater than about 15 μm, such as greater than about 30 μm, greater than about 50 μm, greater than about 75 μm, greater than about 100 μm, greater than about 150 μm, greater than about 200 μm, greater than about 250 μm, greater than about 300 μm, greater than about 400 μm, greater than about 500 μm, or in ranges of about 15 μm to about 50 μm, about 30 to about 75 μm, about 50 μm to about 100 μm, about 75 μm to about 150 μm, about 100 μm to about 200 μm, about 150 micro to about 250 μm, about 200 μm to about 300 μm, about 250 μm to about 400 μm, or about 300 μm to about 500 μm. It is noted that increasing the minimum dimension of the seeds can facilitate alignment of the seeds, allows the seeds to be machined using more traditional machining techniques (e.g., saws), and forms large grains. In another example, the minimum dimension of the seeds can be less than 15 μm, such as when the seeds are formed using etching techniques. In such an example, the seeds can exhibit an average thickness that is less than 10 μm, less than 5 μm, less than 2 μm, less than 1 μm, less than 750 nm, less than 500 nm, less than 250 nm, less than 100 nm, or in ranges of about 100 nm to about 500 nm, about 250 nm to about 750 nm, about 500 nm to about 1 μm, about 750 nm to about 2 μm, about 1 μm to about 5 μm, about 2 μm to about 10 μm, or about 5 μm to about 15 μm. Seeds exhibiting a minimum dimension that is less than 15 μm causes the grains grown from the seeds to be smaller than grains formed from seeds exhibiting a minimum dimension that is greater than 15 μm. As such, polycrystalline textured materials formed from seeds exhibiting a minimum dimension that is less than 15 μm can be used in applications that require smaller grain sizes.

In an embodiment, act 105 can include providing a plurality of seeds that each exhibits a generally right rectangular prism shape. The generally right rectangular shape includes a long axis, a medium axis, and a short axis. The generally right rectangular shape has average thickness that is parallel to the short axis, an average width that is greater than the average thickness and is parallel to the medium axis, and an average length that is greater than the average width and is parallel to the long axis. The average length can be substantially parallel to the longitudinal direction of the seeds. The average thickness of the seeds can be the same as any of the average minimum dimension disclosed herein. The average width of the seeds can be at greater than the average thickness of the seeds, such as at least about 1.25 times, at least about 1.5 times, at least about 2 times, at least 3 times, at least about 5 times, at least 10 times, at least 25 times, at least 50 times, or at least 100 times greater than the average thickness. For instance, the average width of the seeds can be at least about 100 nm, at least about 500 nm, at least about 1 μm, at least about 10 μm, at least about 15 μm, at least about 25 μm, at least about 50 μm, at least about 100 at least about 175 μm, about 250 μm at least about 500 μm, at least about 750 μm, at least about 1 mm, at least about 1.25 mm, at least about 1.5 mm, or in ranges of about 500 nm to about 10 μm, about 1 μm to about 15 μm, about 10 μm to about 25 μm, about 10 μm to about 50 μm, about 25 μm to about 100 μm, about 50 μm to about 175 μm, about 100 μm to about 250 μm, about 175 μm to about 500 μm, about 250 μm to about 750 μm, about 500 μm to about 1 mm, about 750 μm to about 1.25 mm, or about 1 mm to about 1.5 mm. Selecting the average width of the seeds to be greater than the average thickness of the seeds ensures that the surfaces of the seed defined by the average width and the average length is larger than any other surface of the seed and, as such, the seed is more likely to lie on that surface than any other surface of the seed. The average length of the seed can be greater than the average width, such as at least about 1.25, at least about 1.5, at least about 2, at least about 5, at least about 10, at least 25, at least 50, or at least about 100 times greater than the average width. For instance, the seed can exhibit an average length that is at least about 500 nm, at least about 1 μm, at least about 10 μm, at least about 15 μm, at least about 25 μm, at least about 50 μm, at least about 100 μm, at least about 175 μm, at least about 250 μm, at least about 500 μm, at least about 1 mm, at least about 1.5 mm, at least about 2 mm, at least about 2.5 mm, at least about 3 mm, at least about 4 mm, at least about 5 mm, or in ranges of about 500 nm to about 10 μm, about 1 μm to about 15 μm, about 10 μm to about 25 μm, about 10 μm to about 50 μm, 25 μm to about 100 μm, about 50 μm to about 175 μm, about 100 μm to about 250 μm, about 175 μm to about 500 μm, about 250 μm to about 750 μm, about 500 μm to about 1.5 mm, about 1 mm to about 2 mm, about 1.5 mm to about 2.5 mm, about 2 mm to about 3 mm, about 2.5 mm to about 4 mm, or about 3 mm to about 5 mm. Such average lengths can facilitate aligning the seeds in the longitudinal direction thereof.

In an embodiment, act 105 can include providing a plurality of seeds that are premade. In another embodiment, act 105 can include forming the plurality of seeds. In such an embodiment, act 105 can include forming the plurality of seeds using any suitable method. For example, the seeds can be formed using molten salt synthesis. However, seeds formed using a molten salt synthesis method may be difficult to align the crystallographic orientations thereof due to the limited size of such seeds and the limited control of the shape of such seeds. FIG. 2A is a schematic illustration of a method 200 to form a plurality of seeds 202 that facilitate alignment thereof, according to an embodiment. For example, the method 200 can be configured to form single-crystal seeds that exhibit an elongated shape, such as a generally right rectangle prism, that facilitates alignment thereof.

The method 200 includes providing a single-crystal block 204 that has a known crystallographic orientation. The single-crystal block 204 is significantly larger than the seeds 202 produced therefrom, which allows the single-crystal block 204 to form several single-crystal seeds 202. It is noted that the single-crystal block 204 can be substituted with a large polycrystalline textured material exhibiting oriented or grains grown from smaller seeds which can form polycrystalline seeds exhibiting textured or oriented grains.

The method 200 can include forming a first plurality of cuts 206 in the single-crystal block 204 that extend in a first direction and a second plurality of cuts 208 in the single-crystal block 204 that extend in a second direction that is different than the first direction. For example, the second plurality of cuts 208 can be selected to intersect the first plurality of cuts 206, such as intersect the first plurality of cuts 206 at a right angle. The first plurality of cuts 206 and the second plurality of cuts 208 can form the plurality of seeds 202, such as a plurality of seeds 202 exhibiting a generally right rectangular prism shape. In an embodiment, the first and second plurality of cuts 206, 208 only extends partially (e.g., mostly) through the single-crystal block 204. In such an example, the plurality of seeds 202 can extend from and be integrally formed with a base 210. Only forming the first and second plurality of cuts 206, 208 partially through the single-crystal block 204 decreases the number of cuts that need to be formed in the single-crystal block. In another embodiment, the first plurality of cuts 206 extend completely through the single-crystal block 204. In such an embodiment, the first plurality of cuts 206 forms sheets and the second plurality of cuts 208 can be formed in each sheet.

The first and second cuts 206, 208 can be formed using any suitable method. For example, the first and second cuts 206, 208 can be formed using wire EDM, a saw, a laser, etc. For example, wire EDM can form the first and second cuts 206, 208 with precision (e.g., within 15 µm or less) and can substantially prevent vibrations from forming in the single-crystal block 204 which can cause the seeds 202 to become separated from the rest of the single-crystal block 204 prematurely and/or in a non-controlled manner. Additionally, forming the first and second cuts 206, 208 with wire EDM can limit (e.g., substantially prevent) deformation of the seeds 202 during the cutting operation unlike some other machining techniques.

The method 200 can include separating the plurality of seeds 202 from the base 210. The seeds 202 can be separated from the base 210 by forming a third cut (not shown) at or near an intersections between the seeds 202 and the base 210. The third cut can be formed using any of the methods disclosed herein. However, vibrations and other forces generated during the separation process can cause the seeds 202 to become separated from the base 210 prematurely and/or in an uncontrolled manner. Separating the seeds 202 from the base 210 can also result in the separated seeds being scattered. As such, in an embodiment, the method 200 can include at least partially surrounding the plurality of seeds 202 and, optionally, the base 210 in a removable material 212. The removable material 212 is selected to provide structural stability to the plurality of seeds 202 and to be easily removable by melting, dissolving, or decomposing the removable material 212. For example, the removable material 212 can include Crystalbond, which is available from SPI Supplies of West Chester, Pa. In another example, the removable material 212 can include thermoplastics, polymers that dissolve in solvents, or another suitable material. After at least partially surrounding at least the seeds with the removable material 212, the method 200 can include separating the seeds 202 from the base 210. After separating the seeds 202 from the base 210, the method 200 can include removing the removable material 212 from the seeds 202 using any suitable method.

The method 200 shown in FIG. 2A illustrates a method of forming a plurality of seeds that exhibits substantially the same crystallographic orientation. However, it is understood that the method 200 can be easily modified to form at least one first seed exhibiting a first crystallographic orientation, at least one second seed exhibiting a second crystallographic orientation that is different than the first crystallographic orientation, and/or at least one additional seed exhibiting an additional crystallographic orientation that is different than the first and second crystallographic orientations. FIG. 2B is a top plan view of a single-crystal block 204', according to an embodiment. The single-crystal block 204' can include at least one first seed 202a formed therein that exhibits a first crystallographic orientation. In an embodiment, the same single-crystal block 204' or another similar single-crystal block can include at least one second seed 202b formed therein that exhibits a second crystallographic orientation. The second seed 202b can be formed in substantially the same manner as the first seed 202a except that the single-crystal block 204' or the similar single-crystal block is rotated. In another embodiment, the second seed 202b can be formed using the same method as the first seed 202a except that the second seed 202b is formed using a single-crystal block having a different crystallographic orientation than the single-crystal block 204'.

It is noted that the seeds used to form the plurality of seeds can be different than the methods illustrated in FIGS. 2A-2B. For example, the plurality of seeds can be formed using an etching technique. In another example, the plurality of seeds can be precipitated from a solution. In another example, the plurality of seeds can be formed using a chemical or physical vapor deposition technique. In another example, the plurality of seeds can be formed from natural single crystals. In another example, the plurality of seeds can be formed from the single-crystal block using traditional gemstone cutting techniques.

Referring back to method 100 of FIG. 1, the method 100 can include washing the plurality of seeds to remove any contaminants that may be present on an exterior of the seeds. For example, contaminants that are present on the seeds can increase the porosity of the resulting polycrystalline textured material, prevent or inhibit growth of the grains, or affect the grain boundaries of the polycrystalline textured material (e.g., the contaminants or a derivative of the contaminants are disposed in the grain boundaries). As such, the seeds can be cleaned using any suitable method. For instance, the seeds can be washed in a solvent, such as first washing the seeds in acetone followed by washing the seeds in isopropyl alcohol.

The method 100 includes act 110, which recites "aligning at least some of the plurality of seeds so that a selected crystallographic orientation of the at least some of the plurality of seeds are substantially aligned with each other." Substantially aligning the crystallographic orientations of the seeds includes aligning the seeds such that the coordinate systems of the units cells thereof are substantially aligned. For example, substantially aligning the crystallographic orientations of the seeds can include aligning the seeds such that corresponding crystallographic planes and corresponding crystallographic directions of the seeds are substantially aligned (e.g., parallel, collinear, and/or coplanar with each other).

In an example, the seeds are substantially aligned when the crystallographic orientations of each of the aligned seeds deviate at most 30° from an average crystallographic orientation, such as at most 20°, at most 15°, or at most 10° of the average crystallographic orientation. In other words, the seeds are substantially aligned when corresponding axes of the coordinate system (e.g., the x-axes, the y-axes, and/or the z-axes) attached to the unit cells of each of the aligned seeds vary by at most 30°.

In an embodiment, act 105 includes providing a plurality of first seeds exhibiting a first crystallographic orientation and a plurality of second seeds exhibiting a second crystallographic orientation that is different than the first crystallographic orientation. In such an example, act 110 can include aligning the first seeds so that the first crystallographic orientations of the plurality of first seeds are substantially aligned. Similarly, act 110 can include aligning the second seeds so that the second crystallographic orientation of the plurality of second seeds are substantially aligned. Additionally, act 110 can include aligning the second seeds so that the second crystallographic orientation is aligned differently than the first crystallographic orientation of the first seeds.

In an example, act 110 includes manually aligning the at least some of the plurality of seeds to align the crystallographic orientations thereof. In another example, act 110 includes automatically aligning the at least some of the plurality of seeds to align the crystallographic orientations thereof. The system 532 of FIG. 5A is an example of a system that can automatically align the plurality of seeds.

In an example, act 105 can include providing a plurality of seeds that each exhibits an elongated shape having a longitudinal direction. In such an example, act 110 can include aligning the seeds such that the longitudinal direction of the seeds is substantially aligned. For instance, act 110 can include aligning the longitudinal directions of the first and second seeds to be substantially aligned.

The method 100 includes act 115, which recites "positioning the at least some of the plurality of seeds in a powder matrix." In an embodiment, act 115 includes positioning the seed in the powder matrix after aligning the seed. In such an embodiment, act 115 includes positioning the aligned seeds on a surface while substantially maintaining the alignment of the seeds. The surface can include a surface of a platform that is initially substantially free of the powder matrix, a surface of a container (e.g., a surface of a wet bag) that is initially substantially free of the powder matrix, a surface formed from a layer of the powder matrix (e.g., a layer of powder matrix that is disposed on the platform or the container), a surface formed from a mound of the powder matrix, or any other suitable surface. The seeds can be positioned on the surface in a random pattern or an orderly pattern. In such an example, act 115 can also include disposing the powder matrix around the aligned seeds to partially or completely cover the seeds with the powder matrix thereby positioning the seeds in the powder matrix. In another example, act 115 can include providing the powder matrix and then disposing the aligned seeds in the powder matrix while maintaining the alignment of the seeds. In another embodiment, act 115 can include positioning at least some of the plurality of seeds in the powder matrix before or substantially simultaneously with aligning the seed. In such an embodiment, the seeds can be randomly oriented in the powder matrix such that the seeds and the powder matrix do not exhibit a layer-by-layer configuration.

In an embodiment, act 115 can include positioning the aligned seeds on the surface such that at least one corresponding crystallographic direction and/or plane of at least some of the aligned seeds are substantially at least one of collinear, coplanar, non-collinear, or noncoplanar with each other. For example, act 115 can include positioning the aligned seeds on the surface in an orientation that allows at least one corresponding crystallographic direction and/or plane of at least some of the aligned seeds to be substantially collinear and/or coplanar with each other. In such an example, act 115 can include positioning at least some of the aligned seeds in the same row, the same column, the same plane (e.g., positioned on the same plane in a patterned or random arrangement), or another suitable arrangement that allows the corresponding crystallographic directions and/or planes to be collinear and/or coplanar. In another example, act 115 can include positioning the aligned seeds on the surface in an orientation that allows at least one corresponding crystallographic direction and/or plane of at least some of the aligned seeds to be non-collinear and/or not collinear with each other. In such an example, act 115 can include positioning at least some of the aligned seeds in different rows, different columns, randomly, or another suitable arrangement that allows the corresponding crystallographic directions and/or planes to be non-collinear and/or not coplanar.

In an embodiment, act 115 can include forming a plurality of layers that each includes some of the plurality of seeds and some of the powder matrix. In such an embodiment, act 115 includes forming a first layer, a second layer, and, optionally, one or more additional layers. The first layer can include a first quantity of the seeds and a first quantity of the powder matrix and the second layer can include a second quantity of the seeds and a second quantity of the powder matrix. The first layer can be formed by aligning the first quantity of the seeds and positioning the first quantity of seeds in the first quantity of powder matrix. Similarly, the second layer can be formed on the first layer by aligning the second quantity of seeds and positioning the second quantity of seeds in the second quantity of powder matrix. For example, the first layer can be formed by aligning the first quantity of seeds and positioning the first quantity of seeds on a surface. After positioning the first quantity of seeds, act 115 can include disposing the first quantity of powder matrix around to the first quantity of seeds to partially or completely cover the first quantity of seeds. The second layer can be formed on the first layer by aligning the second quantity of seeds and positioning the second quantity of seeds on a surface defined by the first layer. After positioning the second quantity of seeds, act 115 can include disposing the second quantity of powder matrix around the second quantity of seeds to partially or completely cover the second quantity of seeds. If act 115 includes forming the one or more additional layers, the additional layers can be formed in the same or substantially similar manner as the first and second layers.

At least most of the powder matrix is formed from a base material that is selected to grow on the seeds to form grains that are larger than the seeds. In an embodiment, the base material is selected to have a lattice mismatch with the seeds that is less than 15% (e.g., less than 10% or less than 5%) which can promote crystal growth on the seeds. For example, the base material is formed from the same material as the seeds which would result in a lattice mismatch that is about 0% which promotes single-crystal growth. In another example, the base material is formed from a material that is different than the seeds. In an embodiment, the base material and the seeds have a lattice mismatch that is greater than about 15%. In such an embodiment, the base material can be selected to exhibit coincidence site lattice growth with the seed. In an embodiment, the base material can include at least one metal or ceramic, such as any of the metals or ceramics disclosed herein.

Smaller grains tend to transfer material to larger grains during sintering processes which causes the larger grains to grow in the crystallographic orientation thereof. As such, the seeds exhibit an average particle size that is significantly greater than an average grain size of the powder matrix, and in particular the base material. For example, the powder matrix can exhibit an average grain size that is at least 5 times smaller (e.g., at least 10 times smaller, at least 25 times smaller, or at least 50 times smaller) than the average particle size of seeds. In another example, the powder matrix can exhibit an average grain size that is less than about 500 µm, such as less than about 100 µm, less than about 50 µm, or less than about 10 µm. It is noted that the powder matrix can exhibit an average particle size that is greater than the average grain size thereof since the particles of the powder matrix can include a plurality of grains In an embodiment, the powder matrix can be a dry powder matrix which allows the powder matrix to exhibit better densification than a moisture-containing powder matrix. The powder matrix is a dry powder matrix when the powder matrix exhibits a moisture content that is less than about 5 weight %, such as less than about 4 weight %, less than about 3 weight %, less than about 2 weight %, less than about 1 weight %, or substantially 0 weight %. In an embodiment, the powder matrix can include one or more binding agents, one or more lubricants, one or more densification aids, one or more grain-growth inhibitors, or one or more additional sintering aids.

The method 100 includes act 120, which recites "pressing the plurality of seeds and the powder matrix to form a green body." Act 120 can include pressing the plurality of seeds using any suitable process. For example, act 120 can include uniaxial pressing. In another example, act 120 can include cold isostatic pressing (e.g., wet-bag isostatic pressing), or hot isostatic pressing. Cold or hot isostatic pressing can improve the densification of the green body compared to uniaxial pressing, especially if the green body exhibits a complex shape (e.g., a non-right rectangular prism shape).

The method 100 includes act 125, which recites "sintering the green body at a temperature that is sufficient to grow a plurality of grains from corresponding ones of the plurality of seeds to form the polycrystalline textured material." For example, act 125 include sintering the green body at a temperature that is sufficient for the seeds to consume at least a portion of the powder matrix, thereby causing the seeds to grow into grains that include and are larger than the seeds. For example, act 125 can include sintering the green body at a temperature that is about 100° C. to about 2000° C., such as in ranges of about 300° C. to 500° C., about 400° C. to about 600° C., about 700° C., about 600° C. to about 800° C., about 700° C. to about 900° C., about 800° C. to about 1000° C., about 900° C. to about 1100° C., about 1000° C. to about 1200° C., about 1100° C. to about 1300° C., about 1200° C. to about 1400° C., about 1300° C. to about 1500° C., about 1400° C. to about 1600° C., about 1500° C. to about 1700° C., about 1600° C. to about 1800° C., about 1700° C. to about 1900° C., or about 1800° C. to about 2000° C. The exact sintering temperature can depend on the composition of the seed or the composition of the powder matrix (e.g., the base material). For example, the exact sintering temperature can be about 30% to about 99% of the melting temperature of the seed or the powder matrix, such as in ranges of about 30% to about 50%, about 40% to about 70%, about 50% to about 80%, about 70% to about 90%, about 80% to about 95%, about 90% to about 97%, or about 90% to about 99% of the melting temperature of the seed or the powder matrix. The exact sintering temperature can also depend on the density of the green body, the surface area of the green body, the presence of sintering aid, the desired density, the desired grain growth, the sintering time, etc.

Act 125 can include sintering the green body for a time that is sufficient to cause the seeds to grow into larger grains. For example, the sintering time can be selected to ensure that at least some of the plurality of seeds have undergone sufficient grain growth to have consumed a desired portion of the powder matrix. For example, the sintering time can be selected to allow the grain growth of the seed to proceed until at least substantially all of the powder matrix is consumed by the growing seeds. In another example, the sintering time can be selected to enable the seeds and the powder matrix to be joined (e.g., bonded) together with little to no grain growth on the seeds. In another example, the sintering time can be selected to enable to seeds to consume about 1% to about 10%, about 5% to about 15%, 10% to about 30%, about 20% to about 40%, about 30% to about 50%, about 40% to about 60%, about 50% to about 70%, about 60% to about 80%, about 70% to about 90%, about 80% to about 95%, or about 90% to about 99% of the powder matrix. For example, the sintering time can be about 10 minute to about 72 hours, such as in ranges of about 15 minutes to about 1 hours, about 30 minutes to about 2.5 hours, about 1 hours to about 5 hours, about 2.5 hours to about 7.5 hours, about 5 hours to about 10 hours, about 7.5 hours to about 12.5 hours, about 10 hours to about 15 hours, about 12.5 hours to about 17.5 hours, about 15 hours to about 20 hours, about 17.5 hours to about 22.5 hours, about 20 hours to about 25 hours, about 22.5 hours to about 27.5 hours, about 25 hours to about 30 hours, about 27.5 hours to about 35 hours, about 30 hours to about 40 hours, about 35 hours to about 45 hours, about 40 hours to about 50 hours, about 45 hours to about 60 hours, or about 50 hours to about 70 hours. The sintering time required to sinter the green body can depend on the sintering temperature, the volume percent of the green body that is formed from the seeds, the density of the green body, the surface area of the green body, the composition of the seeds and/or the powder matrix, etc.

In an embodiment, act 125 can include sintering the green body in an inert atmosphere, such as in the presence of nitrogen gas, argon gas, or another suitable atmosphere. Sintering the green body in an inert atmosphere can prevent the formation of oxides or other contaminants during the sintering process. The presence of oxides or other contaminants can inhibit grain growth on the seeds and decrease control of the grain boundaries. In an embodiment, act 125 can include sintering the green body in an oxidizing atmosphere, such as in an ambient atmosphere. In such an embodiment, the seeds and/or the powder matrix can be formed from an oxidizing resistant material, such as an oxide (e.g., silicon oxide, aluminum oxide, etc.).

In an embodiment, the method 100 can include machining the green body (e.g., between acts 120 and 125) or machining the polycrystalline textured material (e.g. after act 125). In such an embodiment, the green body or the polycrystalline textured material can be machined to exhibit a selected shape, machined to remove defects therefrom, or polished. The green body or the polycrystalline textured material can be machined using any suitable method. For example, the green body or the polycrystalline textured material can be machined using lapping, grinding, wire EDM, or any other suitable method.

In an embodiment, the method 100 can include characterizing the polycrystalline textured material. For example, the polycrystalline textured material can be characterized using x-ray diffraction to determine the crystallographic orientation of the grains of the polycrystalline textured material, the number of grains exhibiting a certain crystallographic orientation, etc.

Figure 3:
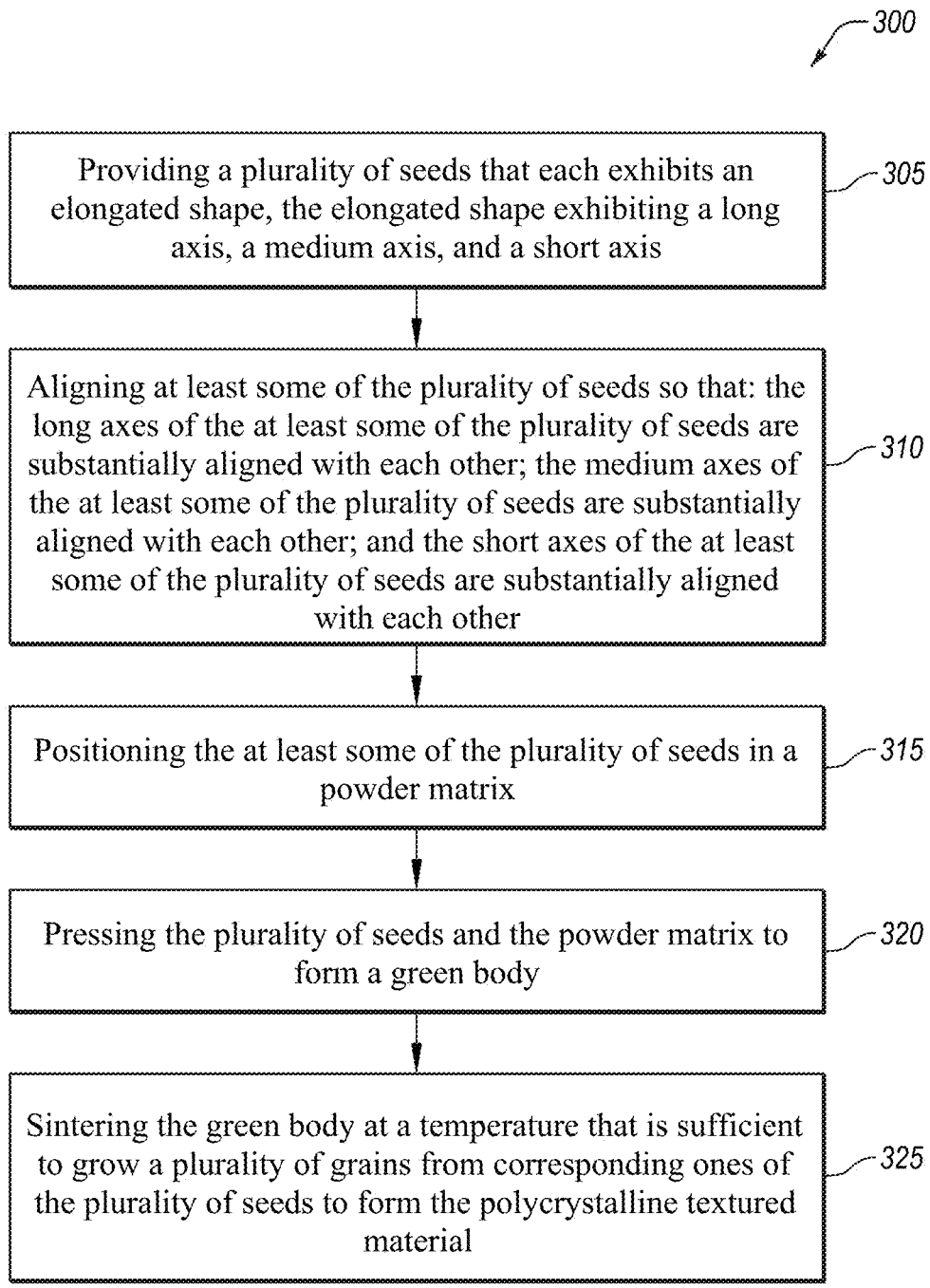
FIG. 3 is a flow chart of a method to form a polycrystalline textured material exhibiting heterogeneous templated grain growth, according to an embodiment.

FIG. 3 is a flow chart of a method 300 to form a polycrystalline textured material exhibiting heterogeneous templated grain growth, according to an embodiment. Unless specified, the acts of the method 300 can be performed in any order. In some embodiments, at least one of the acts can be supplemented, split into a plurality of acts, combined with another act, and/or omitted. Also, it is understood that additional acts can be added to the method 300. For example, the additional acts can include machining the polycrystalline textured material or the green body. In another example, the additional acts can include characterizing the polycrystalline textured material to quantify the crystallographic orientation(s) thereof.

The example method 300 may begin with act 305, which recites "providing a plurality of seeds that each exhibits an elongated shape, the elongated shape exhibiting a long axis, a medium axis, and a short axis." Act 305 can be followed by act 310, which recites "aligning at least some of the plurality of seeds so that: the long axes of the at least some of the plurality of seeds are substantially aligned with each other; the medium axes of the at least some of the plurality of seeds are substantially aligned with each other; and the short axes of the at least some of the plurality of seeds are substantially aligned with each other." Act 310 can be followed by act 315, which recites "positioning the at least some of the plurality of seeds in a powder matrix." Act 315 can be followed by act 320, which recites "pressing the plurality of seeds and the powder matrix to form a green body." Act 320 can be followed by act 325, which recites "sintering the green body at a temperature that is sufficient to grow a plurality of grains from corresponding ones of the plurality of seeds to form the polycrystalline textured material."

Act 305 recites "providing a plurality of seeds that each exhibits an elongated shape, the elongated shape exhibiting a long axis, a medium axis, and a short axis." For example, act 305 can include providing a plurality of seeds that exhibit an elongated shape exhibiting an anisometric geometry, such as seeds exhibiting a generally right rectangular prism shape. In another example, act 305 can include providing a plurality of seeds that exhibits substantially the same shape and/or size, regardless of crystallographic orientation. Providing seeds that exhibit substantially the same shape or size can facilitate alignment of the seeds during act 310. Except as otherwise disclosed herein, the seeds provided during act 305 can be the same as or substantially similar to the seeds provided during act 105 of the method 100.

Act 310 recites "aligning at least some of the plurality of seeds so that: the long axes of the at least some of the plurality of seeds are substantially aligned with each other; the medium axes of the at least some of the plurality of seeds are substantially aligned with each other; and the short axes of the at least some of the plurality of seeds are substantially aligned with each other." For example, the long, medium, and short axes of the aligned seeds are substantially aligned when the long, medium, and short axes of the aligned seed deviated by at most 30° (e.g., at most 20°, at most 15°, at most 10°, or at most) 5° from an average long, medium, and short axes, respectively. For example, act 305 can include providing a plurality of seeds exhibiting a right rectangular prism and act 310 can include aligning the seeds such that the seeds point in the substantially the same direction. In another example, act 310 can include macroscopically aligning at least some of the plurality of seeds such that the seeds are macroscopically aligned.

Aligning the seeds according to act 310 can results in the crystallographic orientations of the seeds that exhibit the same crystallographic orientation being aligned with each other. For example, act 305 can include providing a plurality of first seeds exhibiting a first crystallographic orientation. In such an example, act 310 includes aligning at least some of the first seeds such that the first crystallographic orientations are substantially aligned. In another example, act 305 includes providing a plurality of first seeds exhibiting a first crystallographic orientation and a plurality of second seed exhibiting a second crystallographic orientation. In such an example, act 310 can include aligning at least some of the first seeds such that the first crystallographic orientations are substantially aligned and aligning at least some of the second seeds such that the second crystallographic orientations are substantially aligned. Additionally, act 310 can include aligning the first and second seeds such that the first and second crystallographic orientations of the aligned first and second seeds are not aligned.

Acts 315, 320, and 325 can be the same or substantially similar to the acts 115, 120, and 125 of the method 100.

Figure 4:
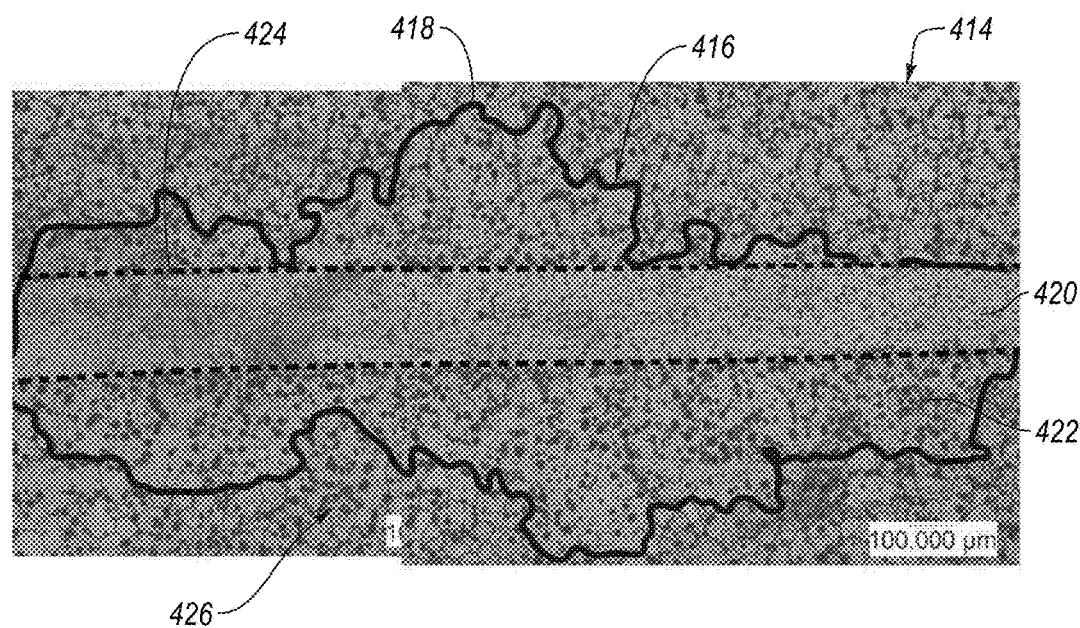
FIG. 4 is a photomicrograph of a portion of a polycrystalline textured material that was formed according to the methods of FIGS. 1 and 3, according to an embodiment.

Sintering the green body forms a polycrystalline textured material that exhibits heterogeneous templated grain growth. FIG. 4 is a photomicrograph of a portion of a polycrystalline textured material 414 that was formed according to the method 100 or 300 of FIGS. 1 and 3, according to an embodiment. The polycrystalline textured material 414 can be a metal, a ceramic, a polymer (e.g., a semi-crystalline polymer or a crystalline polymer), or combinations thereof. The polycrystalline textured material 414 includes a plurality of first grains 416 exhibiting a first crystallographic orientation. As previously discussed, the first crystallographic orientation of each of the plurality of first grains 416 are substantially aligned. For example, each of the first grains 416 includes a coordinate system attached to the unit cells thereof and the coordinate systems of each of the first grains 416 are aligned. FIG. 4 illustrates one of the plurality of first grains 416. FIG. 4 includes a line 418 that delineates the grain boundary of the first grain 416.

Each of the first grains 416 includes a first portion 420 that was formed from a seed and the first grain 416 exhibits the same crystallographic orientation of the seed. The first portion 420 of the first grain 416 can exhibit a shape and size that is substantially similar to the shape and size of the seed. For example, the first portion 420 of the first grain 416 can exhibit a first elongated shape that extends in a first longitudinal direction of the seed. In such an example, the first portions 420 of each of the plurality of first grains 416 can be substantially aligned with each other such that the first longitudinal direction of each of the plurality of first grains 416 are substantially aligned. It is noted that the shape and/or size of the first portion 420 of the first grain 416 can be slightly different than the seed. For example, during acts 120 and 125 of the method 100, the seed and/or first portion 420 can crack, bend (e.g., due to creep), slightly increase or decrease in size (e.g., due to diffusion), or otherwise deform.

Each of the first grains 416 includes a second portion 422 that at least substantially encloses the first portion 420. FIG. 4 includes a line 424 that delineates the first portion 420 from the second portion 422. The second portion 422 was formed from the powder matrix. The second portion 422 also exhibits the same crystallographic orientation of the seed and the first portion 420.

FIG. 4 illustrates the relative porosity of the first grain 416. For example, some of the relatively darker sections of the second portion 422 of the first grain 416 shown in FIG. 4 are pores (the dark sports of the first portion 420 are likely defects caused by polishing, etching, or oxidation). As shown, the first and second portions 420, 422 of the first grain 416 are distinguishable from each other due to the different porosities thereof. The relative porosities of the first and second portions 420, 422 cause the second portion 422 to exhibit a relative density that is less than the first portion 420. For example, the first portion 320 exhibits a first relative density and the second portion 422 exhibits a second relative density that is less than the first relative density. For instance, the first relative density of the first portion 420 can be about 99% to about 100%, about 98.5% to about 99.5%, about 98% to about 99%, about 97% to about 99%, about 96% to about 98%, about 95% to about 97%, about 93% to about 96%, or about 90% to about 95 and the second relative density of the second portion 422 can be about 92% to about 95%, about 90% to about 93%, about 88% to about 91%, about 85% to about 90%, about 83% to about 87%, about 80% to about 85%, about 77% to about 82%, about 75% to about 80%, or less than 77%. The first and second portions 420, 422 exhibit different relative densities because the first portion 420 is formed from a seed that exhibited less porosity than the powder matrix that formed the second portion 422. It is noted that the porosity of the first and/or second portions 420, 422 can be less than the porosity of the seed and/or powder matrix, respectively, due to densification of the green body during act 125 or 325 of the method 100 or 300, respectively. The porosity and the relative density of the first grain 416 can depend on the conditions of acts 120 and 125 of the method 100 or acts 320 and 325 of the method 300 (e.g., the pressure used to form the green body, the sintering temperature and time, whether the green body includes a lubricant, etc.).

The relative density of the polycrystalline textured material 414 can be about 60% to about 99%, such as in ranges of about 60% to about 70%, about 65% to about 75%, about 70% to about 80%, about 75% to about 85%, about 80% to about 90%, about 85% to about 95%, or about 90% to about 99%. In an embodiment, the relative density of the polycrystalline textured material 414 is substantially the same as the relative density of the first grain 416. In another example, the relative density of the polycrystalline textured material 414 can exhibit a relative density that is different than the first grain 416, such as when the polycrystalline textured material 414 includes a plurality of non-textured grains 426 (e.g., grains that are not grown from any of the seeds disclosed herein).

In an embodiment, the polycrystalline textured material 414 can also include a plurality of second grains (not shown). Each of the plurality of second grains exhibits a second crystallographic orientation that is different than the first crystallographic orientation of the first grains 416. The second crystallographic orientation of each of the plurality of second grains are substantially aligned. For example, the coordinate system of the unit cells of the plurality of second grains are substantially aligned. However, the second crystallographic orientation of the second grains is not substantially parallel to the first crystallographic orientation of the first grains 416 (e.g., the coordinate system attached to the unit cells of the second seeds are not aligned with the coordinate system attached to the unit cells of the first seeds).

Each of the plurality of second grains can include a third portion that is formed from a seed and the second grain exhibits the same crystallographic orientation of the seed. The third portion of the second grains can exhibit a size and shape that is substantially similar to the seed that formed the second grain. For instance, the third portion can exhibit a second elongated shape that extends in a second longitudinal direction and the second longitudinal direction of each of the plurality of second grains can be substantially aligned. Additionally, if the first portion exhibits the first elongated shape, the first and second longitudinal directions of each of the first and third portions can be substantially aligned. It is noted that the shape and/or size of the third portion of at least one of the second grains can be slightly different than the shape of the seed that formed the second grain. For example, during acts 120 and 125 of the method 100 or acts 320 and 325 of the method 300, the seed and/or third portion can crack, bend, slightly increase or decrease in size, otherwise deform. Additionally, each of the second grains includes a fourth portion that at least substantially encloses the third portion and exhibits the second crystallographic orientation. The second portion was formed from the powder matrix.

Similar to the first and second portions 320, 322 of the first grains 316, the third and fourth portions of the second grains exhibits different porosities. For example, the third portion can exhibit a third relative density and the fourth portion can exhibit a fourth relative density that is less than the third relative density. For instance, the first relative density of the first portion 420 can be about 99% to about 100%, about 98.5% to about 99.5%, about 98% to about 99%, about 97% to about 99%, about 96% to about 98%, about 95% to about 97%, about 93% to about 96%, or about 90% to about 95 and the second relative density of the second portion 422 can be about 92% to about 95%, about 90% to about 93%, about 88% to about 91%, about 85% to about 90%, about 83% to about 87%, about 80% to about 85%, about 77% to about 82%, about 75% to about 80%, or less than 77%. The overall relative density of the second grain can be about 60% to about 99%, such as in ranges of about 60% to about 70%, about 65% to about 75%, about 70% to about 80%, about 75% to about 85%, about 80% to about 90%, about 85% to about 95%, or about 90% to about 99%. The porosity of the second grain can depend on the conditions of acts 120 and 125 of the method 100 or acts 320 and 325 of the method 300.

The grains of the polycrystalline textured material 414 that are grown from seeds ("textured grains"), such as the first grains 416 and/or the second grains, can exhibit an average grain size that is at least about 10 nm, at least about 100 nm, at least about 500 nm, or in ranges of about 500 nm to about 1 μm, about 750 μm to about 2 μm, about 1 μm to about 5 μm, about 2 μm to about 10 μm, about 5 μm to about 25 μm, about 10 μm to about 50 μm, about 25 μm to about 75 μm, about 50 μm to about 100 μm, about 75 μm to about 150 μm, about 100 μm to about 200 μm, about 150 μm to about 300 μm, about 200 μm to about 400 μm, about 300 μm to about 500 μm, about 400 μm about 700 μm, about 500 μm to about 1 mm, about 750 μm to about 1.5 mm, about 1 mm to about 2 mm, about 1.5 mm to about 2.5 mm, about 2 mm to about 3 mm, about 2.5 mm to about 3.5 mm, about 3 mm to about 4 mm, about 3.5 mm to about 4.5 mm, about 4 mm to about 5 mm, about 4.5 mm to about 5.5 mm, or greater than about 5 mm. The average grain size of textured grains of the polycrystalline textured material 414 can be controlled based on the sintering temperature, the sintering time, the starting grain size, etc. The average grain size of the textured grains of the polycrystalline textured material 414 can affect the applicability of the polycrystalline textured materials (e.g., larger textured grains may form a more efficient solar cell).

It is noted that the polycrystalline textured material 414 can include one or more additional sets of textured grains (e.g., a plurality of third grains, a plurality of fourth grains, etc.) that each exhibit crystallographic orientations that are different than each other and different than the first and second crystallographic orientations of the first grains 416 and the second grains, respectively.

In an embodiment, the polycrystalline textured material 414 can include a plurality of non-textured grains 426 that are disposed between the textured grains of the polycrystalline textured material 414. The non-textured grains 426 are formed from portions of the powder matrix that did not grow on the seeds. The non-textured grains 426 can exhibit random crystallographic orientations, random shape, etc.

The non-textured grain 426 can decrease control over the grain boundaries of the polycrystalline textured material 414. As such, in some embodiments, the method 100 can be configured to minimize the quantity of non-textured grains 426 that are present in the polycrystalline textured material 414. For example, increasing at least one of the sintering temperature or the sintering time can decrease the quantity of the non-textured grains 426. In an embodiment, the polycrystalline textured material 414 can include at most 50 volume % non-textured grains 426, such as in ranges of about 20 volume % to about 50 volume %, about 10 volume % to about 25 volume %, about 7 volume % to about 15 volume %, about 5 volume % to about 10 volume %, about 4 volume % to about 6 volume %, about 2 volume % to about 4 volume %, or less than about 1 volume %.

The polycrystalline textured material 414 can exhibit any suitable shape, such as a sheet, a block, a curved shape, a cylindrical shape, a complex shape, etc. In an example, the polycrystalline textured material 414 can exhibit a minimum dimension (e.g., thickness) that is greater than about 2.5 mm, such as greater than about 5 mm, greater than about 7.5 mm, greater than about 1 cm, greater than about 2 cm, greater than about 4 cm, greater than about 5 cm, or in ranges of about 2.5 mm to about 7.5 mm, about 5 mm to about 1 cm, about 7.5 mm to about 1.5 cm, about 1 cm to about 2 cm, about 1.5 cm to about 4 cm, or about 2 cm to about 5 cm.

Figure 5:
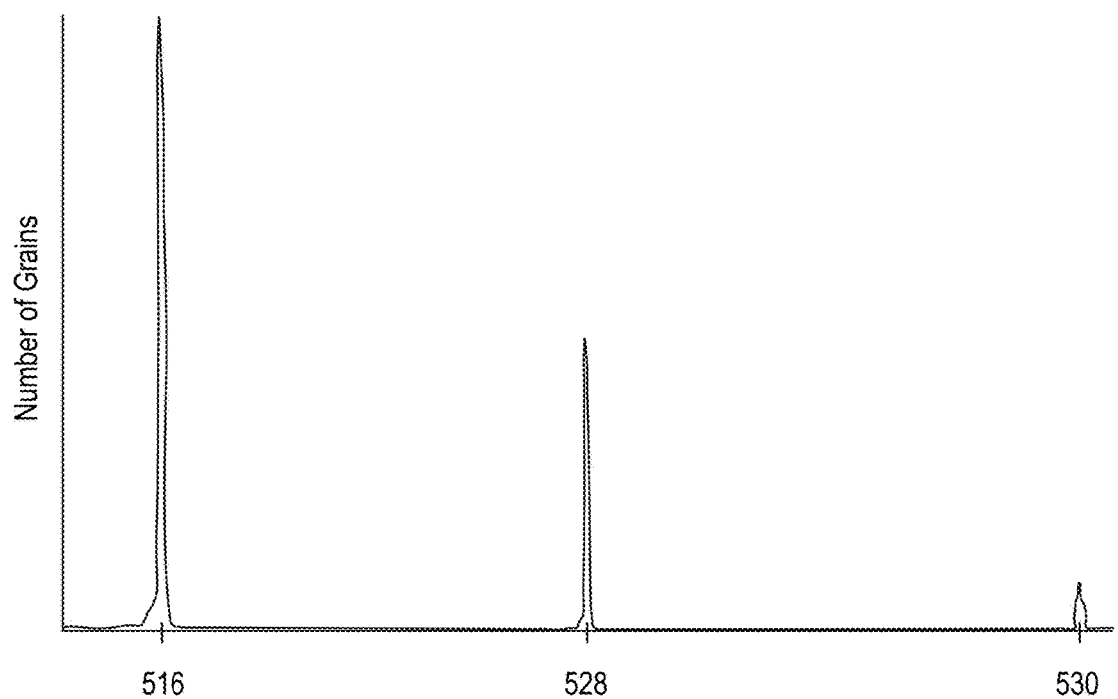
FIG. 5 is a graph illustrating an example of the number of different types of grains that can be used to form a polycrystalline textured material, according to an embodiment.

In an embodiment, the grain boundaries and the crystalline texture of a polycrystalline textured material can be controlled by controlling the number of different types of seeds that are used to form the polycrystalline textured material. FIG. 5 is a graph 500 illustrating an example of the number of different types of grains that can be used to form a polycrystalline textured material, according to an embodiment. For example, the polycrystalline textured material can be formed from a plurality of first grains 516 exhibiting a first crystallographic orientation, a plurality of second grains 528 exhibiting a second crystallographic orientation that is different than the first crystallographic orientation, and a plurality of third grains 530 exhibiting a third crystallographic orientation that is different than the first and second crystallographic orientations. The grain boundaries and the crystalline texture of the polycrystalline textured material can be controlled by controlling the number of the first, second, and third grains 516, 528, 530 that are used to form the polycrystalline textured material. As illustrated, the polycrystalline textured material is formed from more of the first grains 516 than the second grains 528 and more of the second grains 528 than the third grains 530.

In an embodiment, the grain boundaries and the crystalline texture of the polycrystalline textured material can be changed by increasing at least one of the quantity of the first grains 516 relative to the second and/or third grains 528, 530, the quantity of the second grains 528 relative to the first and/or third grains 516, 530, or the quantity of the third grains 530 relative to the first and/or second grains 516, 528. In an embodiment, the grain boundaries and the crystalline texture of the polycrystalline textured material can be changed by omitting one of the second or third grains 528, 530 from the polycrystalline textured material. In another embodiment, the grain boundaries and the textured nature of the polycrystalline textured material can be changed by forming the polycrystalline textured material from one or more additional grains (e.g., a plurality of fourth grains, a plurality of fifth grains, etc.) that each exhibit a crystallographic orientation that is different than the first, second, and third crystallographic orientations of the first, second, and third grains 516, 528, 530.

Figure 6A:
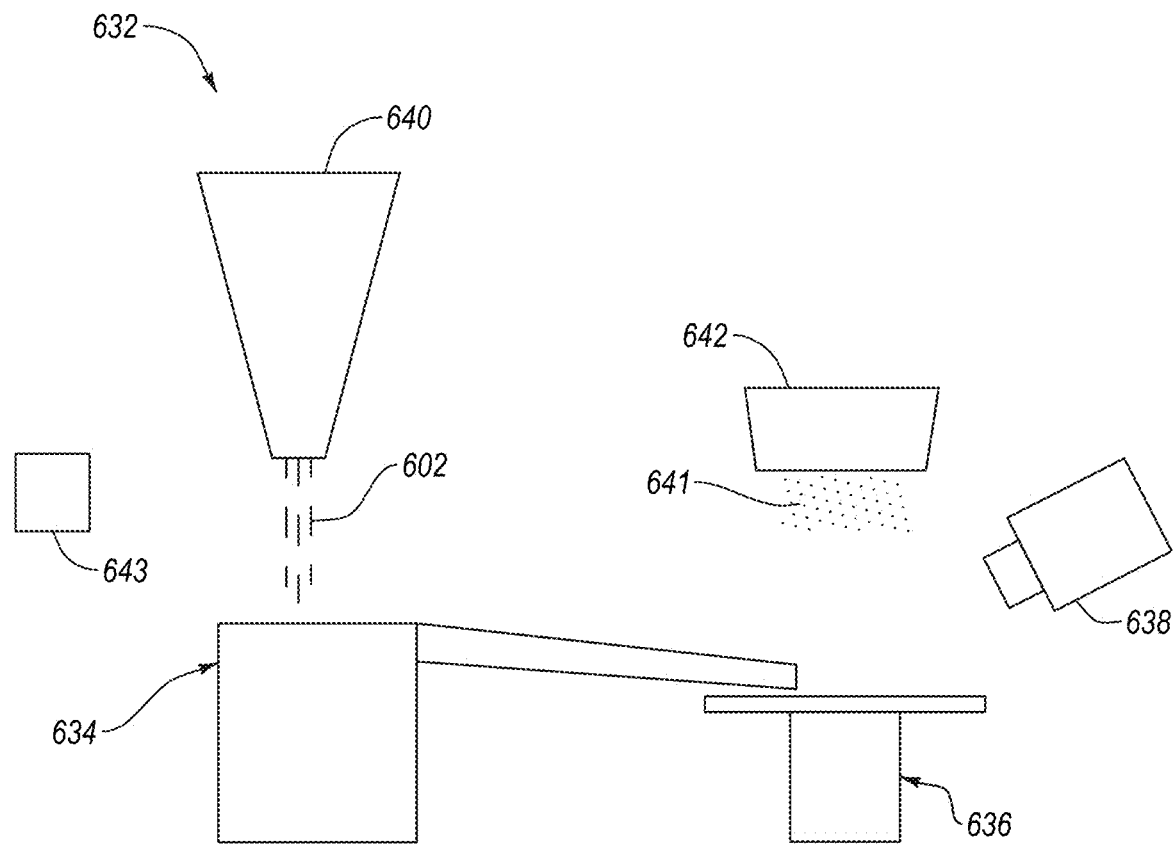
FIG. 6A is schematic of a system that is configured to perform the methods of FIGS. 1 and 3, according to an embodiment.

FIG. 6A is schematic of a system 632 that is configured to perform the method 100 of FIG. 1, according to an embodiment. The system 632 includes an aligner 634 that is configured to align and dispense a plurality of seeds 602 and a platform 636 positioned to receive the seeds 602 from the aligner 634. The system 632 can also include an image detector 638 (e.g., camera) that is configured to detect an alignment of the seeds 602 on the platform 636. The system 632 can also include at least one seed reservoir 640 that is configured to supply the aligner 634 with the seeds 602. In an embodiment, the seed reservoir 640 can include only a single type of seed that all exhibit the same crystallographic orientation. In another embodiment, the seed reservoir 640 can include a plurality of different types of seeds (e.g., a plurality of first seeds, a plurality of second seeds) that are randomly mixed together. In an embodiment, the system 632 also includes at least one powder reservoir 642 that is configured to dispense a powder matrix 641, such as dispense the powder matrix 641 onto the platform 636 (e.g., around the seeds 602 that are positioned on the platform 636). In another embodiment, powder matrix 641 can be combined with the seeds 602 in the seed reservoir 640 and/or the powder reservoir 642 is configured to dispense the powder matrix 641 onto the aligner 634. The system 632 can also include a controller 643 that is coupled to one or more of the aligner 634, the platform 636, the image detector 638, the seed reservoir 640, and the powder matrix reservoir 642 and is configured to control the operation of the system 632.

Figure 6B:
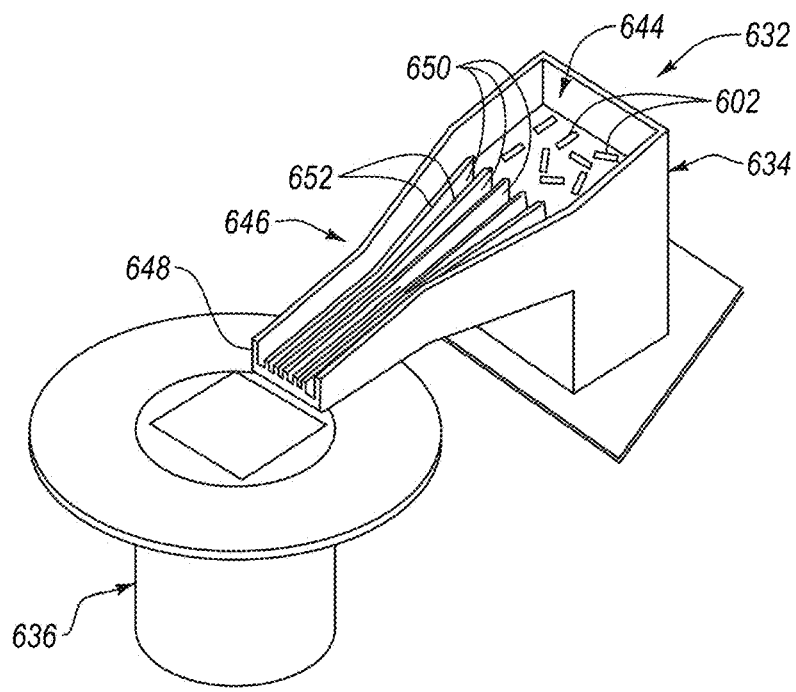
FIG. 6B is a schematic of a portion of the system of FIG. 6A illustrating the aligner and the platform, according to an embodiment.

FIG. 6B is a schematic of a portion of the system 632 of FIG. 6A illustrating the aligner 634 and the platform 636, according to an embodiment. The aligner 634 includes a loading portion 644 that is configured to hold the seeds 602 thereon. For example, if the system 632 includes the seed reservoir 640, the loading portion 644 can be configured to receive the seeds 602 that are dispensed from the seed reservoir 640. In an embodiment, the loading portion 644 can be configured to hold the powder matrix thereon. For example, the loading portion 644 can be configured to receive the seeds 602 that are premixed with the powder matrix 641 or the powder reservoir 642 can be configured to dispense the powder matrix 641 onto the loading portion 644.

The aligner 634 also includes an aligning portion 646 that extends from the loading portion 644 towards an outlet 648 of the aligner 634. The aligning portion 646 is configured to align the seeds 602. For example, if the seeds 602 exhibit an elongated shape, the aligning portion 646 can be configured to align the seeds 602 such that the longitudinal directions of the seeds 602 are substantially aligned in the same direction.

In a particular example, the aligning portion 646 can include a plurality of channels 650 that are separated by a plurality of walls 652. The walls 652 can exhibit a constant height or a height that varies (e.g., increases or decrease along at least a portion of a length thereof). The channels 650 exhibiting a spacing that is configured to align the seeds 602. For instance, the spacing of the channels 650 can be only slightly greater than the width of the seed 602. In an embodiment, the spacing of the channels 650 can vary along at least a portion of a length thereof. For example, a portion of the channels 650 that is at or near the loading portion 644 can exhibit a first spacing and a portion of the channels 650 that is at or near the outlet 648 of the aligner 634 can exhibit a second spacing that is less than the first spacing. The second spacing can be only slightly greater than the width of the seeds 602. As such, the first spacing can facilitate the seeds 602 entering the channels 650 while the second spacing aligns the seeds 602.

The aligner 634 can be configured to controllably move the seeds 602 from the loading portion 644, through the aligning portion 646, and to the outlet 648 of the aligner 634. In an embodiment, the aligner 634 exhibits a generally downward slope from the loading portion 644 to the outlet 648. In such an embodiment, the aligner 634 can vibrate, thereby promoting movement of the seeds 602 down the aligning portion 646. For example, a vibratory device (e.g., a piezoelectric vibratory device or other suitable vibratory device) can be provided to vibrate the aligner 634. The amount that the aligner 634 vibrates can depend on one or more characteristics sensed by the image detector 638. For example, the image detector 638 (FIG. 6A) detects that too many seeds 602 are being positioned on the platform 636 or the alignment of the seeds 602 is poor. For example, the image detector 638 may include a digital camera or other suitable machine vision system. In such an example, the controller 643 (FIG. 6A) can receive the detected characteristics from the image detector 638 and, responsive to receiving the detected characteristics, direct the aligner 634 to decrease the vibrations thereof. In another example, the image detector 638 detects that not enough seeds 602 are being positioned on the platform 636 or that the seeds 602 are not being sufficiently dispersed. In such an example, the controller 643 can receive the detected characteristics from the image detector 638 and, responsive to receiving the detected characteristics, direct the aligner 634 to increase the vibrations thereof.

Figure 6C:
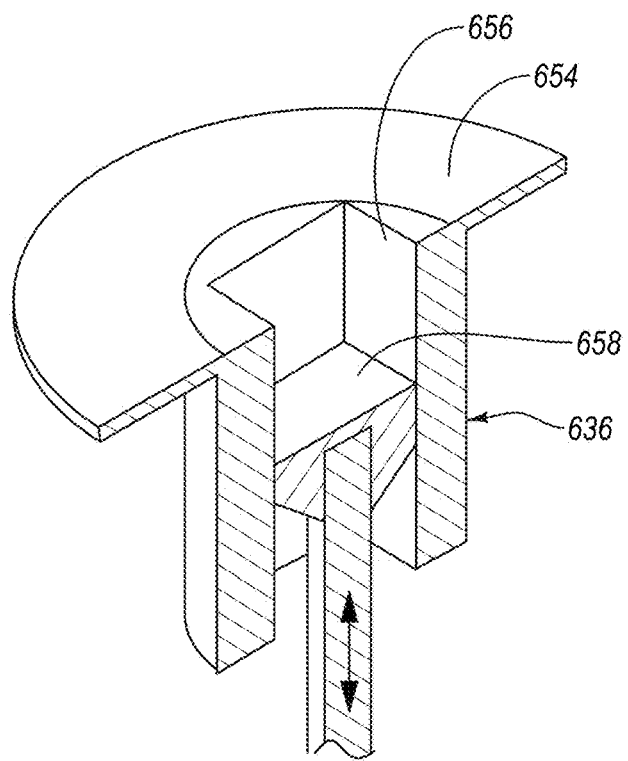
FIG. 6C is a schematic cutaway view of a portion of the platform, according to an embodiment.

FIG. 6C is a schematic cutaway view of a portion of the platform 636, according to an embodiment. The platform 636 can include an upper surface 654 and at least one lateral surface 656 that extends downwardly from the upper surface 654. The platform 636 can also include a moveable surface 658 that is positioned between the at least one lateral surface 656 and is moveable relative to the upper surface 654. The moveable surface 658 is configured to receive the seeds 602 dispensed from the aligner 634 (FIG. 6B) and the powder matrix 641 dispensed from the powder matrix reservoir 642 (FIG. 6A).

In operation, the moveable surface 658 can receives the seeds 602 from the aligner 634. The moveable surface 658 is substantially planar with or below the upper surface 654 when the moveable surface 658 receives the seeds 602. In an example, after receiving the seeds 602, the moveable surface 658 can move downwardly relative to the upper surface and then the moveable surface 658 can receive the powder matrix 641 from the powder matrix reservoir 642 such that the seeds 602 are at least partially covered by the powder matrix 641 to form a first layer. In another example, the moveable surface 658 can receive the seeds 602 and the powder matrix 641 substantially simultaneously, such as when the seeds 602 are premixed with the powder matrix 641. After receiving the seeds 602 and the powder matrix 641, the moveable surface 658 can move downwardly relative to the upper surface 654. Then, the moveable surface 658 can receive additional amounts of the seeds 602 and the powder matrix 641 (e.g., the additional amounts of seeds 602 and powder matrix 641 are disposed on the first layer).

It is noted that the platform 636 shown in FIG. 6C is merely an example of a platform that can be used in the system 632. In another example, the system 632 can include a platform that includes an upper surface that is configured to receive the seeds 602 and the powder matrix 641. The upper surface of the platform can be moveable (e.g., vertically or horizontally) or stationary. The platform can also include a container (e.g., wet bag) disposed on the upper surface of the platform. In another example, the platform can include a conveyor belt. In such an example, the conveyor belt can be moveable or stationary in a vertical direction.

Figure 7A:
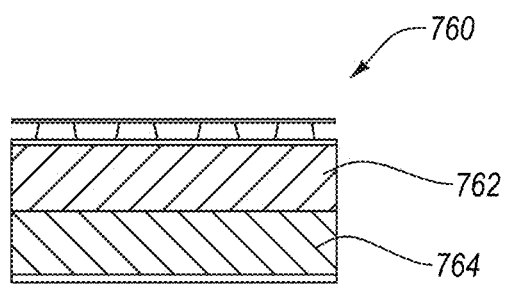
FIG. 7A is a schematic cross-sectional view of a solar cell that can include any of the polycrystalline textured materials disclosed herein, according to an embodiment.

The polycrystalline textured materials disclosed herein can be used in several different applications. For example, FIG. 7A is a schematic cross-sectional view of a solar cell 760 that can include any of the polycrystalline textured materials disclosed herein, such as a polycrystalline textured silicon, according to an embodiment. The solar cell 760 can include one or more layers, such as a first layer 762 (e.g., an n-doped silicon layer) and a second layer 764 (e.g., a p-doped silicon layer). At least one of the one or more layers can include the polycrystalline textured silicon. The polycrystalline textured silicon can absorb solar energy better than other polycrystalline silicon because the plurality of aligned grains of the polycrystalline textured silicon behave more like a single-crystal silicon than polycrystalline silicon. Additionally, the polycrystalline texture silicon has better availability and is easier to manufacture than single-crystal silicon.

Figure 7B:
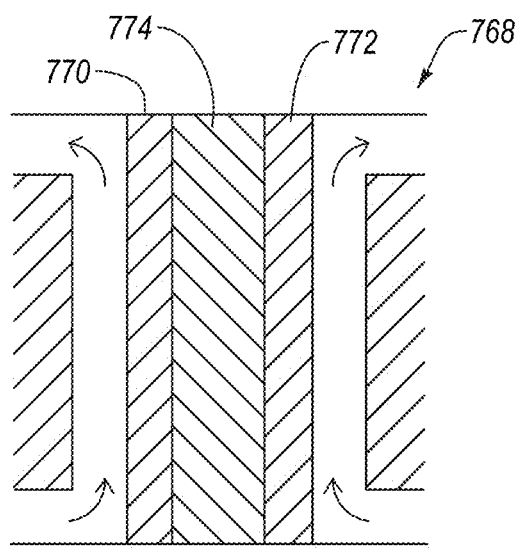
FIG. 7B is a schematic cross-sectional view of a fuel cell that can include any of the polycrystalline textured materials disclosed herein, according to an embodiment.

In another example, FIG. 7B is a schematic cross-sectional view of a fuel cell 768 that can include any of the polycrystalline textured materials disclosed herein, according to an embodiment. For example, the fuel cell 768 can include an anode 770, a cathode 772, and an electrolyte 774 (e.g., a liquid or solid electrolyte 774) disposed between the anode 770 and the cathode 772. The anode 770, the cathode 772, and the electrolyte 774 are configured to have gases and/or ions flowing (e.g., diffuse) therethrough. The ability of the gases and/or ions to flow through the anode 770, the cathode 772, and the electrolyte 774 can depend on the grain boundaries, and in particular the grain boundary diffusivities, of the anode 770, the cathode 772, and the electrolyte 774. As such, at least one of the anode 770, the cathode 772, or the electrolyte 774 can include any of the polycrystalline textured materials disclosed herein since the grain boundaries of the polycrystalline textured material can be configured to improve the flow of the gas and/or ions therethrough.

Figure 7C:
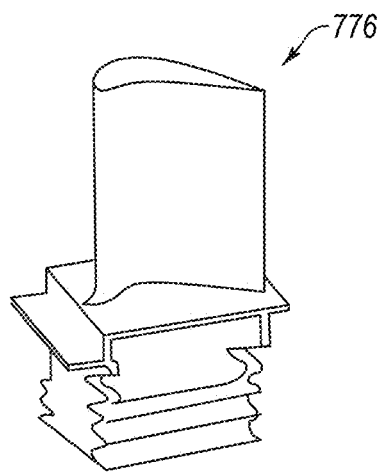
FIG. 7C is a schematic cross-sectional view of a turbine blade that can include any of the polycrystalline textured materials disclosed herein, according to an embodiment.

In another example, FIG. 7C is a schematic cross-sectional view of a turbine blade 776 that can include any of the polycrystalline textured materials disclosed herein, according to an embodiment. For instance, a common problem with the turbine blade 776 is that it can exhibit creep at high temperatures. However, the turbine blade 776 can include any of the polycrystalline textured materials disclosed herein because the polycrystalline textured materials can be tailored to resist creep.

It is noted that the polycrystalline textured materials disclosed herein can be used in other applications. For example, the polycrystalline textured materials can form magnetic or superconducting materials since the magnetic or superconducting properties of such materials can depend, at least in part, on the crystallographic orientation of the magnetic or superconducting materials.

While various aspects and embodiments have been disclosed herein, other aspects and embodiments are contemplated. The various aspects and embodiments disclosed herein are for purposes of illustration and are not intended to be limiting.

What is claimed is:

1. A method to form a polycrystalline textured material exhibiting heterogeneous templated grain growth, the method comprising:
    providing a plurality of seeds, the plurality of seeds including a plurality of first seeds and at least one second seed, the plurality of first seeds exhibiting a first crystallographic orientation relative to a coordinate system of each of the plurality of first seeds, the at least one second seed exhibiting a second crystallographic orientation relative to a coordinate system of the at least one second seed, wherein the first crystallographic orientation is different than the second crystallographic orientation when the coordinate system of each of the plurality of first seeds and the coordinate system of the at least one second seed are aligned;

aligning at least some of the plurality of first seeds so that coordinate systems of the at least some of the plurality of first seeds are substantially aligned with each other;

positioning the plurality of seeds in a powder matrix;

pressing the plurality of seeds and the powder matrix to form a green body; and sintering the green body at a temperature that is sufficient to grow a plurality of grains from corresponding ones of the plurality of seeds to form the polycrystalline textured material.

2. The method of claim 1, wherein the plurality of seeds includes a plurality of single-crystal seeds.

3. The method of claim 1, wherein the plurality of seeds exhibits a minimum dimension that is at least about 15 μm.

4. The method of claim 1, wherein the plurality of seeds exhibits a minimum dimension that is less than about 15 μm.

5. The method of claim 1, wherein providing a plurality of seeds includes cutting the plurality of seeds from at least one single-crystal block.

6. The method of claim 5, wherein cutting the plurality of seeds from the single-crystal block includes:

forming a first plurality of cuts in a first direction extending through at least a portion of the at least one single-crystal block; and forming a second plurality of cuts in a second direction extending through at least a portion of the at least one single-crystal block, the second plurality of cuts intersecting the first plurality of cuts;

wherein forming the first and second plurality of cuts forms at least one of the plurality of first seeds extending from a base.

7. The method of claim 6, further comprising separating the at least one of the plurality of first seeds from the base.

8. The method of claim 7, wherein separating the at least one of the plurality of first seeds from the base includes:

enclosing at least the at least one of the plurality of first seeds in removable material;

separating at least the at least one of the plurality of first seeds from the base; and after separating the at least one of the plurality of seeds from the base, removing the removable material from the at least one of the plurality of seeds.

9. The method of claim 1, wherein each of the plurality of seeds exhibits an elongated shape that exhibits an anisometric geometry.

10. The method of claim 1, wherein positioning the plurality of seeds in a powder matrix includes forming a plurality of layers each of which includes some of the plurality of seeds and some of the powder matrix.

11. The method of claim 10, wherein forming a plurality of layers includes forming a first layer, wherein forming a first layer includes:

disposing a first quantity of the plurality of seeds in a container or on a platform; and after disposing a first quantity of the plurality of seeds in a container or on a platform, disposing a first quantity of the powder matrix about the first quantity of the plurality of seeds.

12. The method of claim 11, wherein forming a plurality of layers includes, after forming the first layer, forming a second layer, wherein forming the second layer includes:

disposing a second quantity of the plurality of seeds on the first layer; and after disposing a second quantity of the plurality of seeds on the first layer, disposing a second quantity of the powder matrix about the second quantity of the plurality of seeds.

13. The method of claim 1, wherein the act of positioning the plurality of seeds in a powder matrix is performed before or substantially simultaneously with the act of aligning at least some of the plurality of first seeds.

14. The method of claim 1, wherein positioning the plurality of seeds in a powder matrix includes disposing the plurality of seeds in a wet bag.

15. The method of claim 1, wherein positioning the plurality of seeds in a powder matrix includes positioning the plurality of seeds in a dry powder matrix.

16. The method of claim 1, wherein pressing the plurality of seeds and the powder matrix includes pressing the plurality of seeds and the powder matrix using a hot or cold isostatic press.

17. The method of claim 1, wherein sintering the green body includes sintering the green body in a vacuum or an inert atmosphere.

18. The method of claim 1, wherein sintering the green body includes sintering the green body for about 1 hour to about 72 hours.

19. The method of claim 1, wherein sintering the green body includes sintering the green body at a temperature of about 100° C. to about 2000° C.

20. The method of claim 1, wherein, after sintering the green body, the polycrystalline textured material exhibits a first plurality of grains exhibiting the first crystallographic orientation and at least one second grain exhibiting the second crystallographic orientation.

21. A method to form a polycrystalline textured material exhibiting heterogeneous templated grain growth, the method comprising:

providing a plurality of seeds that each exhibits an elongated shape, the elongated shape exhibiting a long axis, a medium axis, and a short axis, the plurality of seeds including a plurality of first seeds and at least one second seed, the plurality of first seeds exhibiting a first crystallographic orientation relative to a coordinate system of each of the plurality of first seeds, the at least one second seed exhibiting a second crystallographic orientation relative to a coordinate system of the at least one second seed, wherein the first crystallographic orientation is different than the second crystallographic orientation when the coordinate system of each of the plurality of first seeds and the coordinate system of the at least one second seed are aligned, wherein the coordinate system of the plurality of first seeds and the coordinate system of the at least one second seed are aligned with the long axis, the medium axis, and the short axis thereof;

aligning at least some of the plurality of seeds so that:
the long axes of the at least some of the plurality of seeds are substantially aligned with each other;
the medium axes of the at least some of the plurality of seeds are substantially aligned with each other; and
the short axes of the at least some of the plurality of seeds are substantially aligned with each other;

positioning the plurality of seeds in a powder matrix;

pressing the plurality of seeds and the powder matrix to form a green body; and sintering the green body at a temperature that is sufficient to grow a plurality of grains from corresponding ones of the plurality of seeds to form the polycrystalline textured material.

22. The method of claim 21, wherein aligning at least some of the plurality of seeds includes aligning at least one of the plurality of first seeds and the at least one second seed such that the first crystallographic orientation of the at least one first seed, relative to a coordinate system of each of the plurality of first seeds, is not substantially aligned with the second crystallographic orientation of the at least one second seed, relative to a coordinate system of the at least one second seed.

23. The method of claim 21, wherein providing a plurality of seeds includes providing a plurality of seeds exhibiting a generally right rectangular prism.

24. The method of claim 21, wherein the plurality of seeds exhibits a minimum dimension that is at least about 15 μm.

25. The method of claim 21, wherein the plurality of seeds exhibits a minimum dimension that is less than about 15 μm.

26. The method of claim 21, wherein providing a plurality of seeds includes cutting the plurality of seeds from at least one single-crystal block.

27. The method of claim 26, wherein cutting the plurality of seeds from the single-crystal block includes:

forming a first plurality of cuts in a first direction extending through at least a portion of the at least one single-crystal block; and forming a second plurality of cuts in a second direction extending through at least a portion of the at least one single-crystal block, the second plurality of cuts intersecting the first plurality of cuts;

wherein forming the first and second plurality of cuts forms the at least one first seed extending from a base.

28. The method of claim 27, further comprising separating the at least one first seed from the base.

29. The method of claim 28, wherein separating the at least one first seed from the base includes:

enclosing the plurality of seeds in removable material;

separating the plurality of seeds from the base; and after separating the plurality of seeds from the base, removing the removable material from the plurality of seeds.

30. The method of claim 21, wherein sintering the green body includes sintering the green body in a vacuum or an inert atmosphere.

31. A machine to form a polycrystalline textured material exhibiting heterogeneous textured grain growth, the machine comprising:

at least one aligner including:

a loading portion that is configured to hold a plurality of seeds;

an aligning portion extending from the loading portion to an outlet thereof;

wherein the aligning portion includes a plurality of channels that are separated by walls, the plurality of channels exhibiting a first width at or near the loading portion and a second width at or near the outlet that is less than the first width; and a platform positioned to receive the plurality of seeds that are dispensed from the outlet of the at least one aligner.

32. The machine of claim 31, wherein the at least one aligner is configured to vibrate.

33. The machine of claim 31, wherein the platform includes at least one container that is positioned and configured to receive the plurality of seeds dispensed from the outlet of the at least one aligner.

34. The machine of claim 33, wherein the at least one container includes at least one wet bag.

35. The machine of claim 31, further comprising at least one powder matrix reservoir that is configured to hold a powder matrix therein and controllably dispense the powder matrix towards the platform.

36. The machine of claim 31, further comprising an image detector positioned to detect an alignment of the plurality of seeds on the platform.

37. The machine of claim 31, further comprising a controller that is communicably coupled to the at least one aligner and/or the platform, the controller configured to control the operation of the at least one aligner and/or the platform.

38. The method of claim 1, wherein aligning the plurality of seeds includes aligning at least some of the plurality of seeds to have zero rotational degrees of freedom.

39. The method of claim 21, wherein:

the at least one first seed includes a plurality of first seeds; and aligning the plurality of seeds includes aligning the at least some of the plurality of first seeds so that coordinate systems of the at least some of the plurality of first seeds are substantially aligned with each other.

40. The method of claim 21, wherein aligning the plurality of seeds includes aligning at least some of the plurality of seeds to have zero rotational degrees of freedom.

41. The method of claim 1, wherein the at least one second seed includes a plurality of second seeds; and further comprising aligning at least some of the plurality of second seeds so that:

coordinate systems of the at least some of the plurality of second seeds are substantially aligned with each other.

* * * * *